(12) United States Patent
Meade et al.

(10) Patent No.: US 9,345,135 B2
(45) Date of Patent: *May 17, 2016

(54) ELECTRONIC DEVICES INCLUDING TWO OR MORE SUBSTRATES ELECTRICALLY CONNECTED TOGETHER AND METHODS OF FORMING SUCH ELECTRONIC DEVICES

(71) Applicant: Micron Technology, Inc., Boise, ID (US)

(72) Inventors: Roy E. Meade, Boise, ID (US); Gurtej S. Sandhu, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/454,550

(22) Filed: Aug. 7, 2014

(65) Prior Publication Data

US 2014/0340861 A1 Nov. 20, 2014

Related U.S. Application Data

(63) Continuation of application No. 14/038,472, filed on Sep. 26, 2013, now Pat. No. 8,837,212, which is a continuation of application No. 13/155,064, filed on Jun. 7, 2011, now Pat. No. 8,570,798, which is a continuation of application No. 12/401,387, filed on Mar. 10, 2009, now Pat. No. 7,969,774.

(51) Int. Cl.
*G11C 11/14* (2006.01)
*H05K 1/02* (2006.01)
(Continued)

(52) U.S. Cl.
CPC .............. *H05K 1/0298* (2013.01); *G11C 11/16* (2013.01); *G11C 19/0808* (2013.01);
(Continued)

(58) Field of Classification Search
CPC ........ G11C 11/16; G11C 11/15; G11C 11/14; G11C 8/10; G11C 8/08; G11C 8/12; G11C 8/14

USPC ..................... 365/171, 173, 230.06
See application file for complete search history.

(56) References Cited

U.S. PATENT DOCUMENTS 5,672,400 A 9/1997 Hansen et al.
6,025,618 A 2/2000 Chen
(Continued)

FOREIGN PATENT DOCUMENTS

JP 03020021 A 1/1991
JP 11204742 A 7/1999
(Continued)

OTHER PUBLICATIONS

Devarajan et al., Die-on-Wafer and Wafer-Level Three-Dimensional (3D) Integration of Heterogeneous IC Technologies for RF-Microwave-Millimeter Application, Mater. Res. Soc. Symp. Proc. vol. 833, 2005, pp. 229-234.
(Continued)

*Primary Examiner* — Pho M Luu
(74) *Attorney, Agent, or Firm* — TraskBritt

(57) ABSTRACT

Electronic devices may include a first substrate including circuitry components within the substrate, a microscale bond pad on a surface of the substrate, and a via electrically connecting the microscale bond pad to one of the circuitry components. A distance between centers of at least some adjacent circuitry components of the circuitry components may be a nanoscale distance. A second substrate may be electrically connected to the microscale bond pad. Methods of forming electronic devices may involve positioning a first substrate adjacent to a second substrate and electrically connecting the second substrate to a microscale bond pad on a surface of the first substrate. The first substrate may include circuitry components within the first substrate and a via electrically connecting the microscale bond pad to one of the circuitry components. A distance between centers of at least some adjacent circuitry components of the circuitry components may be a nanoscale distance.

20 Claims, 7 Drawing Sheets

(51) Int. Cl.

| | |
|---|---|
| *G11C 11/16* | (2006.01) |
| *H01L 23/00* | (2006.01) |
| *H05K 1/11* | (2006.01) |
| *H05K 1/14* | (2006.01) |
| *H05K 3/36* | (2006.01) |
| *H05K 7/04* | (2006.01) |
| *H05K 3/46* | (2006.01) |
| *G11C 19/08* | (2006.01) |
| *G11C 11/15* | (2006.01) |
| *G11C 8/08* | (2006.01) |
| *G11C 8/10* | (2006.01) |
| *H05K 3/34* | (2006.01) |
| *B82Y 99/00* | (2011.01) |

(52) U.S. Cl.
CPC .............. *H01L 24/02* (2013.01); *H01L 24/80* (2013.01); *H05K 1/112* (2013.01); *H05K 1/113* (2013.01); *H05K 1/144* (2013.01); *H05K 3/36* (2013.01); *H05K 3/4697* (2013.01); *H05K 7/04* (2013.01); *B82Y 99/00* (2013.01); *G11C 8/08* (2013.01); *G11C 8/10* (2013.01); *G11C 11/14* (2013.01); *G11C 11/15* (2013.01); *H01L 2224/04042* (2013.01); *H01L 2924/014* (2013.01); *H01L 2924/0105* (2013.01); *H01L 2924/01006* (2013.01); *H01L 2924/01013* (2013.01); *H01L 2924/01014* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/01093* (2013.01); *H01L 2924/12042* (2013.01); *H05K 3/3436* (2013.01); *H05K 2201/09381* (2013.01); *Y10S 977/932* (2013.01); *Y10T 29/49126* (2015.01); *Y10T 29/49128* (2015.01)

(56) References Cited

U.S. PATENT DOCUMENTS

| | | | |
|---|---|---|---|
| 6,124,634 A | 9/2000 | Akram et al. | |
| 6,128,214 A * | 10/2000 | Kuekes | B82Y 10/00 365/151 |
| 6,218,731 B1 * | 4/2001 | Huang | H01L 23/13 257/678 |
| 6,391,658 B1 | 5/2002 | Gates et al. | |
| 6,583,502 B2 * | 6/2003 | Lee | H01L 25/0652 257/678 |
| 6,693,002 B2 | 2/2004 | Nakamura et al. | |
| 6,787,917 B2 * | 9/2004 | Lee | H01L 25/0652 257/685 |
| 6,834,005 B1 | 12/2004 | Parkin | |
| 6,887,769 B2 | 5/2005 | Kellar et al. | |
| 6,898,132 B2 | 5/2005 | Parkin | |
| 6,920,062 B2 | 7/2005 | Parkin | |
| 6,971,160 B1 | 12/2005 | Welch et al. | |
| 7,037,804 B2 | 5/2006 | Kellar et al. | |
| 7,057,249 B2 | 6/2006 | Anthony et al. | |
| 7,236,386 B2 | 6/2007 | Parkin | |
| 7,439,082 B2 | 10/2008 | Rinerson et al. | |
| 7,474,004 B2 | 1/2009 | Leedy | |
| 7,489,583 B2 | 2/2009 | Kuekes et al. | |
| 7,494,907 B2 | 2/2009 | Brown et al. | |
| 7,622,377 B2 | 11/2009 | Lee et al. | |
| 7,786,467 B2 | 8/2010 | Williams et al. | |
| 7,833,842 B2 | 11/2010 | Williams et al. | |
| 7,969,774 B2 * | 6/2011 | Meade | G11C 11/16 365/158 |
| 8,570,798 B2 * | 10/2013 | Meade | G11C 11/16 365/158 |
| 8,837,212 B2 * | 9/2014 | Meade | G11C 11/16 365/171 |
| 2005/0006734 A1 | 1/2005 | Harun et al. | |
| 2005/0078511 A1 | 4/2005 | Parkin | |
| 2005/0091440 A1 | 4/2005 | Isa et al. | |
| 2008/0042179 A1 | 2/2008 | Haller et al. | |
| 2008/0044930 A1 | 2/2008 | Gupta | |
| 2008/0105864 A1 | 5/2008 | Park | |
| 2008/0112240 A1 | 5/2008 | Han | |
| 2008/0239785 A1 | 10/2008 | Gaidis et al. | |
| 2008/0268618 A1 | 10/2008 | Yamazaki | |
| 2008/0283995 A1 | 11/2008 | Bucki et al. | |
| 2008/0288720 A1 | 11/2008 | Atwal et al. | |
| 2011/0233774 A1 | 9/2011 | Meade et al. | |
| 2014/0029225 A1 | 1/2014 | Meade et al. | |

FOREIGN PATENT DOCUMENTS

| | | |
|---|---|---|
| JP | 2003242774 A | 8/2003 |
| JP | 2005135453 A | 5/2005 |
| JP | 2007096119 A | 4/2007 |
| JP | 2007150208 A | 6/2007 |
| JP | 2008059705 A | 3/2008 |

OTHER PUBLICATIONS

International Search Report for International Application No. PCT/US2010/026235, dated Sep. 27, 2010, 3 pages.

International Written Opinion for International Application No. PCT/US2010/026235, dated Sep. 27, 2010, 3 pages.

International Preliminary Report on Patentability for International Application No. PCT/US2010/026235, dated Sep. 13, 2011, 4 pages.

* cited by examiner

ELECTRONIC DEVICES INCLUDING TWO OR MORE SUBSTRATES ELECTRICALLY CONNECTED TOGETHER AND METHODS OF FORMING SUCH ELECTRONIC DEVICES

CROSS-REFERENCE TO RELATED APPLICATIONS

This application is a continuation of U.S. patent application Ser. No. 14/038,472, filed Sep. 26, 2013, now U.S. Pat. No. 8,837,212, issued Sep. 16, 2014, which is a continuation of U.S. patent application Ser. No. 13/155,064, filed Jun. 7, 2011, now U.S. Pat. No. 8,570,798, issued Oct. 29, 2013, which is a continuation of U.S. patent application Ser. No. 12/401,387, filed Mar. 10, 2009, now U.S. Pat. No. 7,969,774, issued Jun. 28, 2011, the disclosure of each of which is incorporated herein in its entirety by this reference.

TECHNICAL FIELD

Embodiments of the present disclosure relate to electronic devices comprising at least two substrates bonded together.

BACKGROUND

Electronic devices, and specifically semiconductor devices and memory devices, are becoming increasingly more complex. Accordingly, circuitry area or space, also termed "real estate," in electronic devices is becoming more and more limited. In an effort to provide more circuitry on a single semiconductor chip without increasing the size, as well as in an effort to reduce the size of other semiconductor chip, the circuitry has become increasingly smaller and a greater number of circuits are formed on a single chip. For example, memory devices have reduced from microscale devices and circuits to nanoscale devices and circuits. Nanoscale is conventionally defined as referring to circuits and pitches less than 100 nanometers.

An example of a memory device having memory cells formed on the nanoscale includes magnetic shift registers, conventionally referred to as "racetrack memory." An example of racetrack memory is described in U.S. Pat. No. 6,834,005 to Parkin, assigned to International Business Machines Corporation (IBM). FIG. 10 of the drawings of the present application is a perspective view illustrating a prior art embodiment of an array of racetrack memory. Racetrack memory may include an array of nanoscale wires or tracks 1010 made of a ferromagnetic material. Each track 1010 may include a plurality of magnetic shift registers 1020 connected to each other in series. Each magnetic shift register 1020 includes a writing device 1030 and a reading device 1040 associated therewith. Because of the small size of the tracks 1010, the array of tracks 1010 may be arranged very close together in a memory device. While nanoscale memory cells are desirable for providing increased storage capacity in a limited real estate, conventional supporting circuitry (e.g., charge pumps, decode-and-addressing circuits, sense amplifiers, I/O circuits, etc. (not shown)) of a memory device may not need to be formed on such a small scale and, indeed, may be more efficiently and economically formed on a microscale as opposed to a nanoscale.

DETAILED DESCRIPTION

The illustrations presented herein are, in some instances, not actual views of any particular substrates, electronic devices, or memory devices, but are merely idealized representations which are employed to describe illustrative embodiments. Additionally, elements common between figures may retain the same numerical designation.

Figure 1:
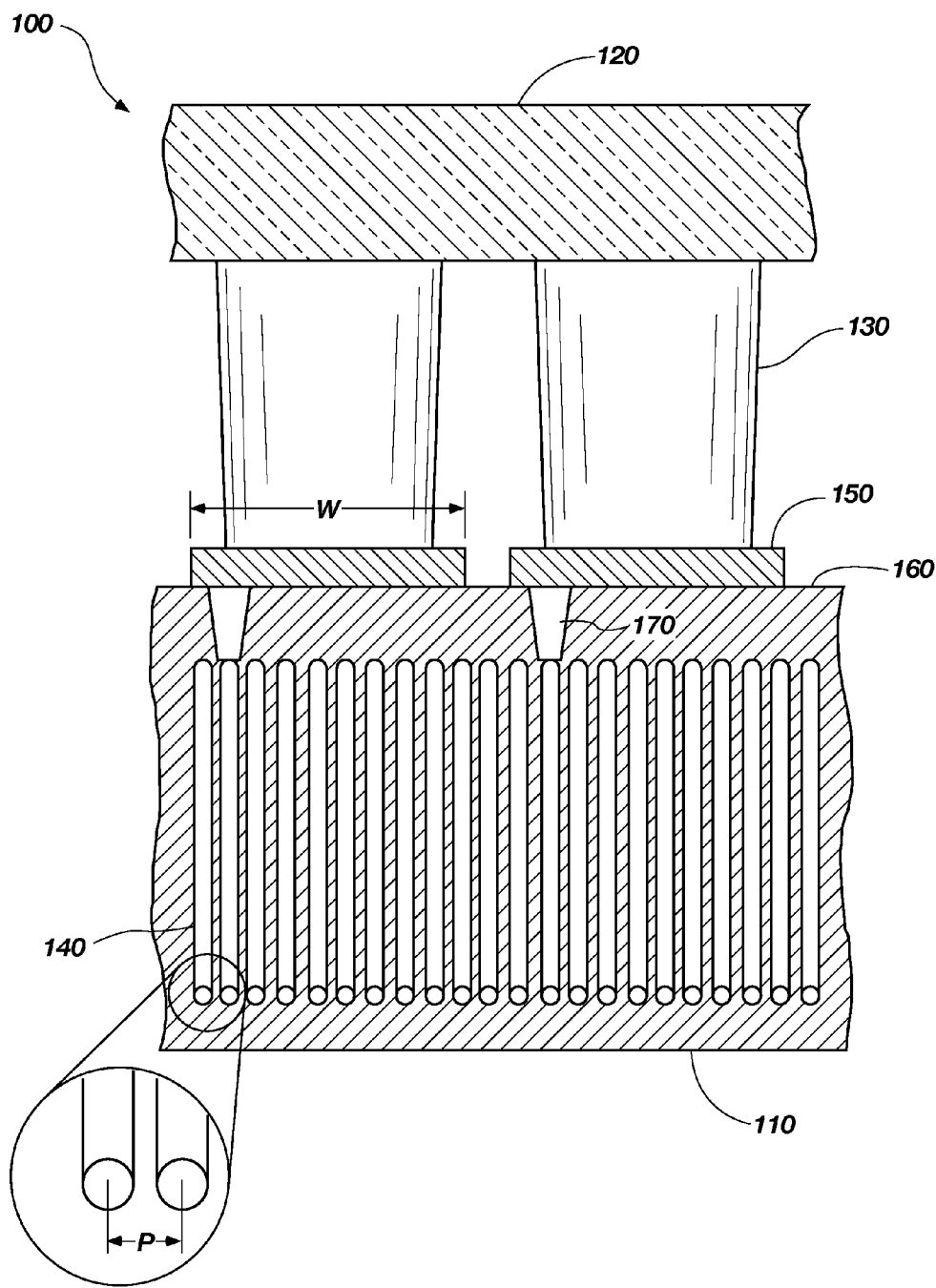
FIG. 1 is a cross-sectioned elevation view of a portion of an electronic device, according to one or more embodiments.

Various embodiments of the present disclosure comprise electronic devices configured to couple nanoscale electronic components, nanoscale pitches, or both, to microscale electronic components, microscale pitches, or both. FIG. 1 is a cross-sectioned elevation view of a portion of an electronic device 100, according to at least one embodiment. The electronic device 100 comprises a first substrate 110 and a second substrate 120 coupled together. The first substrate 110 and second substrate 120 may comprise semiconductor wafers or other bulk semiconductor substrates in some embodiments, or singulated semiconductor dice in other embodiments.

The first substrate 110 comprises circuitry 140 disposed in a portion thereof. At least a portion of the circuitry 140 may comprise a small footprint that is densely configured. By way of example and not limitation, components of circuitry 140 may be configured and disposed comprising a pitch P of less than 100 nanometers. In at least some embodiments, at least a portion of the components of circuitry 140 may comprise a plurality of conductive traces extending at least substantially parallel to each other through a portion of the first substrate 110.

Bond pads 150 may be disposed on a surface 160 of the first substrate 110 and a plurality of vias 170 may extend from adjacent at least a portion of the circuitry 140 to the bond pads 150. By way of example and not limitation, the bond pads 150 may be sized and configured to comprise an area of about 2,000 μm² or greater. By way of example and not limitation, in at least some embodiments, the bond pads 150 may be configured substantially square and may be sized about 50×50 μm.

The bond pads 150 may be disposed in a pattern on the surface 160 of the first substrate 110 to provide a connection to each of the vias 170. Because the bond pads 150 comprise a substantially larger size (microscale) than the components of circuitry 140 (nanoscale), each bond pad 150 may comprise a width W extending over an area that crosses a portion of circuitry 140 comprising a plurality of components (e.g., conductive traces). For example, each bond pad 150 may comprise a width W extending over two or more conductive traces of circuitry 140. Although the figures illustrate circuitry 140 comprising approximately ten or eleven conductive traces below the width W of each bond pad 150, the differences in scales between the circuitry 140 and the bond pads 150 may facilitate hundreds or even thousands of such conductive traces below the width W of each bond pad 150 according to various embodiments.

Figure 2:
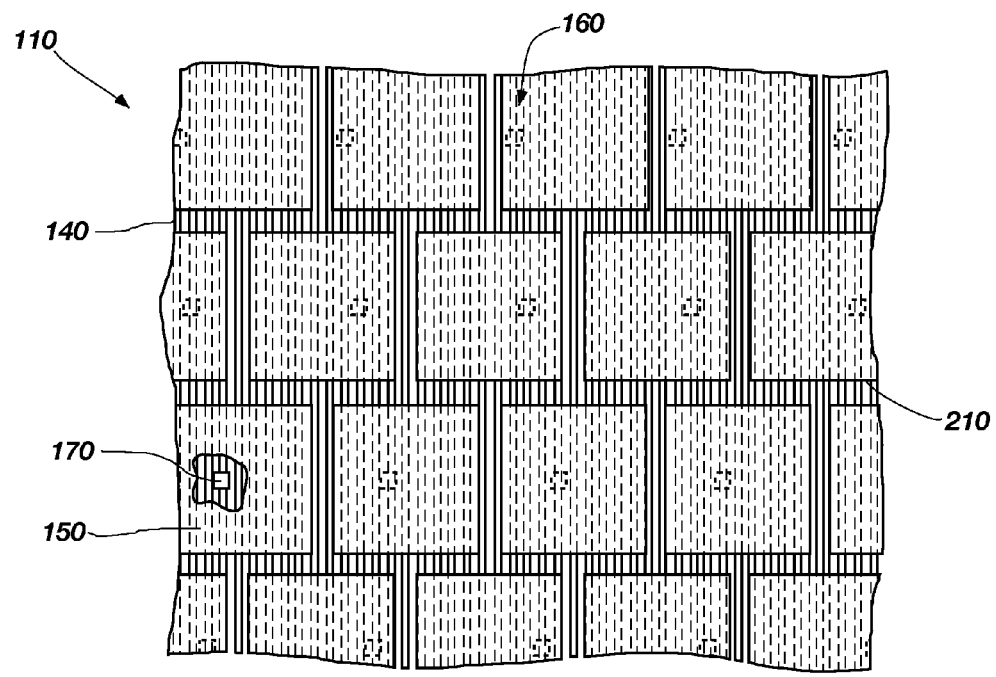
FIG. 2 illustrates a top view of a portion of a first substrate depicting a plurality of bond pads disposed in a predefined pattern, according to some embodiments.

FIG. 2 illustrates a top view of a portion of the first substrate 110 depicting a plurality of bond pads 150 disposed in a predefined pattern according to some embodiments. Such embodiments, in which the bond pads 150 are disposed according to a predefined pattern, may be referred to herein as a "bond raster" pattern. The bond pads 150 are depicted as partially transparent in order to illustrate the relationship between the circuitry 140, vias 170 and bond pads 150. According to various embodiments, a plurality of bond pads 150 may be disposed on the surface 160 in a fixed pattern to facilitate coupling the circuitry 140 to the bond pads 150 through vias 170. In the embodiments shown, the bond pads 150 are fixed in a pattern akin to bricks laid in a wall, in which each bond pad 150 is offset with respect to the bond pads 150 directly above and below (as oriented in FIG. 2), although those of ordinary skill in the art will recognize that any fixed pattern is contemplated as within the scope of embodiments of the invention. In some embodiments, the fixed offset may be approximately half the length of a side 210 of the bond pads 150. In such embodiments, the vias 170 may not be oriented in a fixed pattern. In other words, the vias 170 may not be coupled to the circuitry 140 in any apparent pattern.

Figure 3:
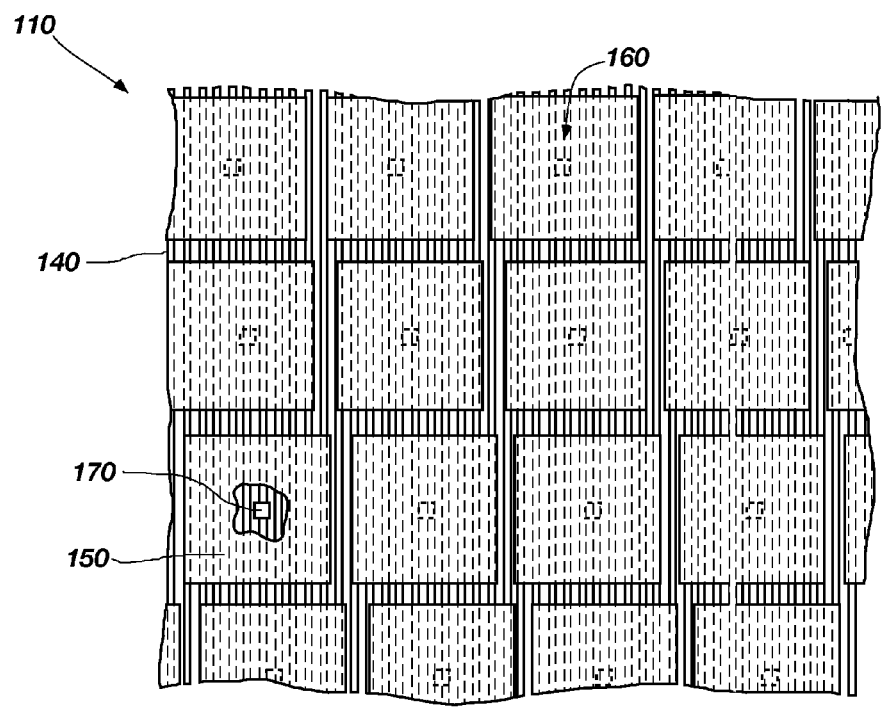
FIG. 3 illustrates a top view of a portion of a first substrate depicting a plurality of bond pads disposed according to a predefined pattern of vias, according to some embodiments.

FIG. 3 is a top view of a portion of a first substrate 110 depicting the bond pads 150 disposed according to other embodiments. According to at least some of such embodiments, the vias 170 may be coupled to the center, or at least substantially the center, of the respective bond pad 150, and the vias 170 may be configured according to a predefined pattern. In the embodiment of FIG. 3, the vias 170 are positioned in a pattern wherein each via is coupled to a conductive trace immediately adjacent to the conductive trace to which the via above and below (as oriented in FIG. 3) are coupled. The bond pads 150 are, therefore, shifted in accordance with the pattern of the vias 170. Such a configuration, of shifting the bond pads 150 in accordance with the predefined pattern of the vias 170, may be referred to herein as a "bond shift" pattern.

FIGS. 2 and 3 illustrate bond pads 150 having a substantially square or rectangular shape. However, those of ordinary skill in the art will recognize that a plurality of potential shapes and patterns have utility in implementation of various embodiments. By way of example and not limitation, FIGS. 4 through 6 illustrate various suitable configurations for the bond pads 150 according to embodiments of the first substrate 110.

Figure 4:
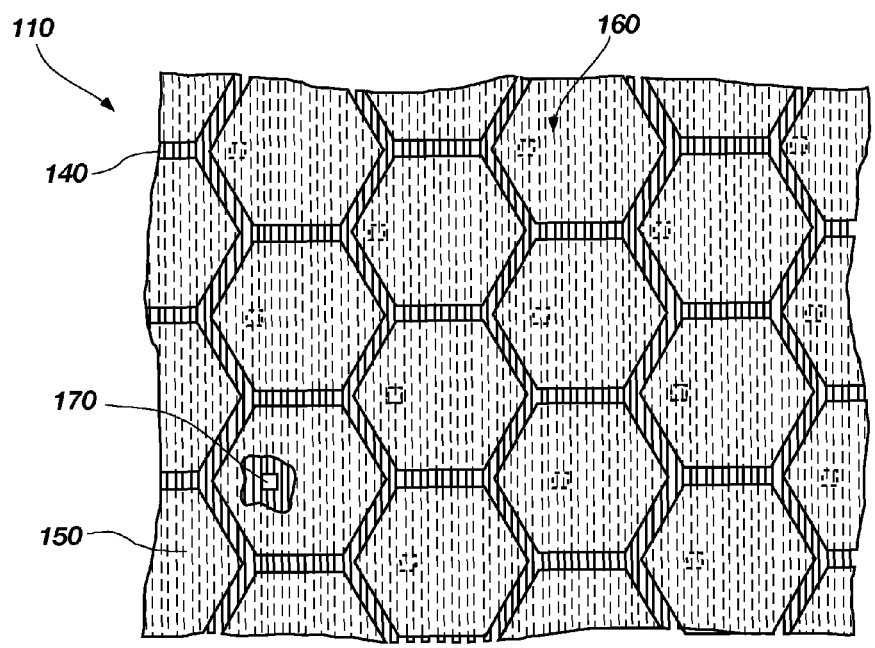
FIG. 4 is a top view of a portion of a first substrate depicting bond pads configured in a honeycomb pattern on a surface of the first substrate, according to at least one embodiment.

FIG. 4 is a top view of a portion of a first substrate 110 depicting the bond pads 150 configured with a hexagonal shape and disposed in a honeycomb pattern on the surface 160. The vias 170 are shown as coupled to respective conductive traces of the circuitry 140 in accordance with the pattern of the bond pads 150. Such a honeycomb pattern may be formed to comprise a bond raster pattern in which the bond pads 150 are disposed according to a predefined pattern.

Figure 5:
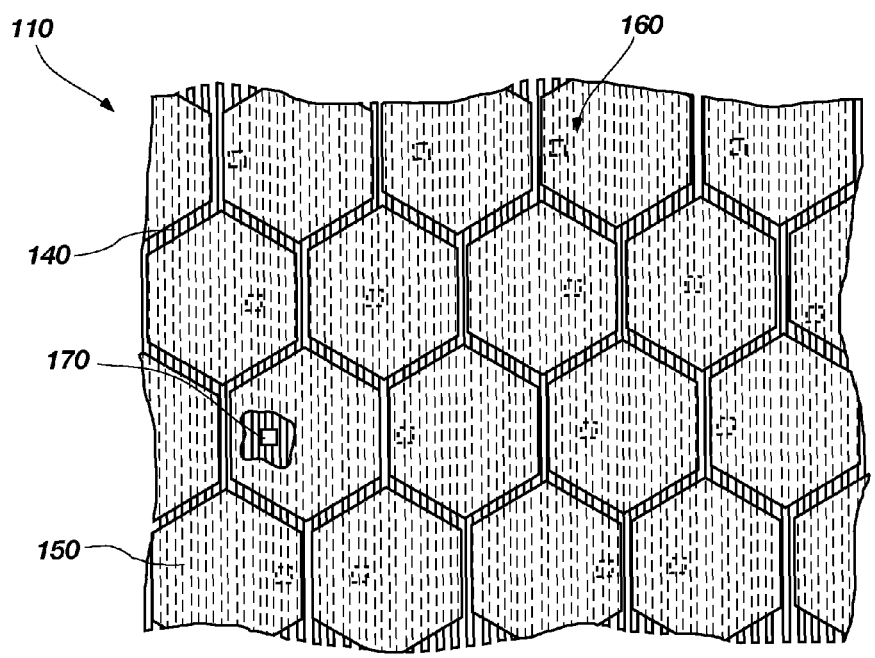
FIG. 5 illustrates a top view of a portion of a first substrate comprising bond pads configured in a honeycomb pattern on the surface thereof, according to at least one embodiment.

FIG. 5 illustrates another embodiment of the first substrate 110 comprising bond pads 150 configured with a hexagonal shape and disposed in a honeycomb pattern, comprising a bond raster pattern on the surface 160. In the embodiment of FIG. 5, the bond pads 150 are rotated slightly, in a few degrees about their centerpoints, resulting in a pattern that provides an improved coverage of the circuitry 140. The improved coverage is provided by disposing the bond pads 150 in a configuration that is angularly misaligned with the underlying circuitry 140 comprising conductive traces. In other words, according to the embodiment as illustrated in FIG. 5, the bond pads 150 are not disposed in columns that run straight up and down in alignment with the underlying circuitry 140 that is configured to run substantially straight up and down (as oriented in FIG. 4). Such misalignment may improve the coverage of the circuitry 140 by providing at least one bond pad 150 that is positioned over each component of the circuitry 140 to enable coupling a via 170 for each component of the circuitry 140 to a substantially centralized portion of a bond pad 150. In other words, because the bond pads 150 are angularly misaligned with the underlying circuitry 140, each component of the circuitry 140, such as the conductive traces of FIG. 5, may have at least one bond pad 150 that is positioned substantially centrally thereover, enabling a via 170 to be positioned, and extend between each component of the circuitry 140 and a substantially central portion of a bond pad 150. Thus, vias 170 do not need to be coupled to a bond pad 150 along a peripheral edge thereof.

Figure 6:
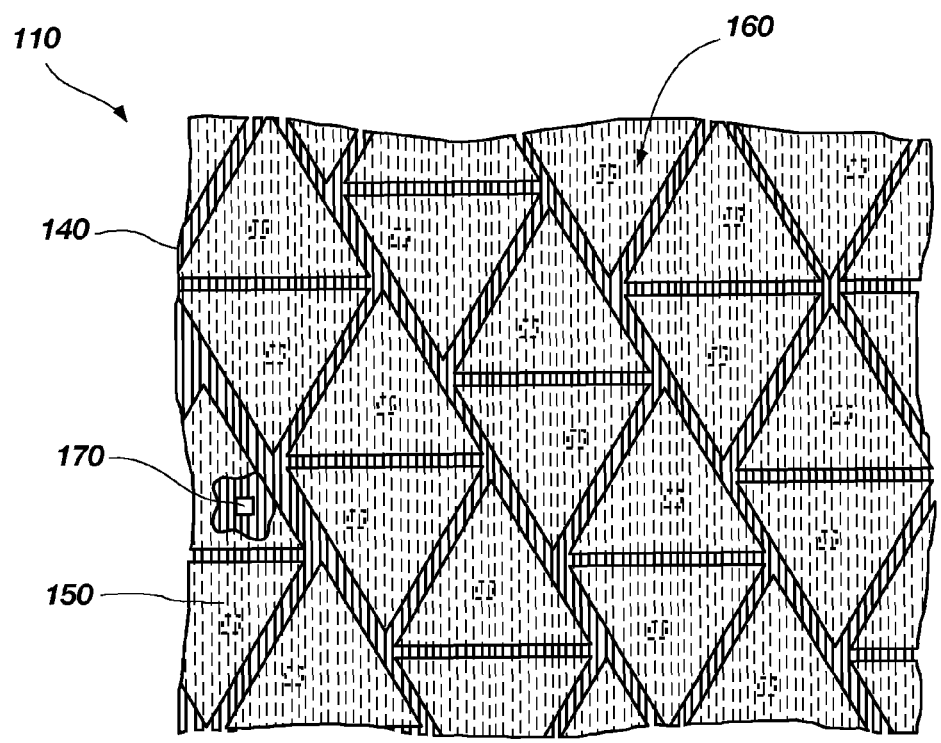
FIG. 6 illustrates a top view of an embodiment of the first substrate comprising bond pads having a triangular configuration.

FIG. 6 illustrates another embodiment of the first substrate 110 comprising bond pads 150 having a triangular configuration and comprising a bond raster pattern. The bond pads 150 are ordered in pairs configured with bases of the triangles positioned facing each other and aligned together on the surface 160. The triangular-shaped bond pads 150 are also angularly misaligned with the underlying circuitry 140. In the embodiment shown, the bond pads 150 are disposed according to a pattern, while there is no apparent pattern by which the vias 170 are coupled to the circuitry 140.

Conductive bumps 130 (FIG. 1) may be formed on the bond pads 150 to electrically couple the bond pads 150 of the first substrate 110 to the second substrate 120 and any support circuitry thereon. The conductive bumps 130 may comprise any bump configuration known to those of ordinary skill in the art. By way of example, the conductive bumps 130 may be configured as bumps, pillars, studs, balls, columns, posts, or any other suitable physical structure, as well as combinations thereof. The conductive bumps 130 may comprise any conductive metal or alloy thereof, such as copper, gold, silver, aluminum, and alloys of any of the foregoing, conventional silver or tin/lead solder, a conductive or conductor-filled polymer, or conductive composites.

Figure 7A:
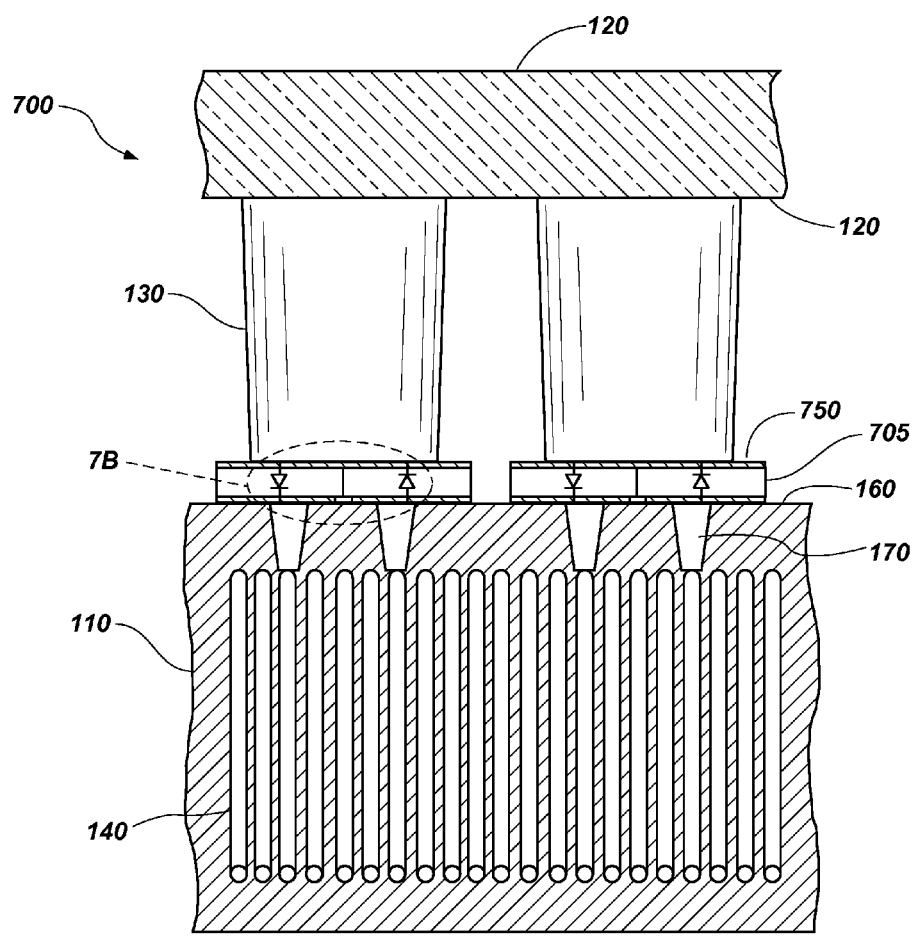
FIG. 7A is a cross-sectioned elevation view of a portion of an electronic device, according to at least one embodiment.

In additional embodiments, an electronic device may be configured to reduce the number of bond pads necessary to couple the circuitry 140 to a respective bond pad. FIG. 7A is a cross-sectioned elevation view of a portion of an electronic device 700 according to at least one embodiment. The electronic device 700 comprises a first substrate 110 and a second substrate 120 coupled together. The first substrate 110 and second substrate 120 may comprise semiconductor wafers or other bulk semiconductor substrates in some embodiments, or singulated semiconductor dice in other embodiments.

Figure 7B:
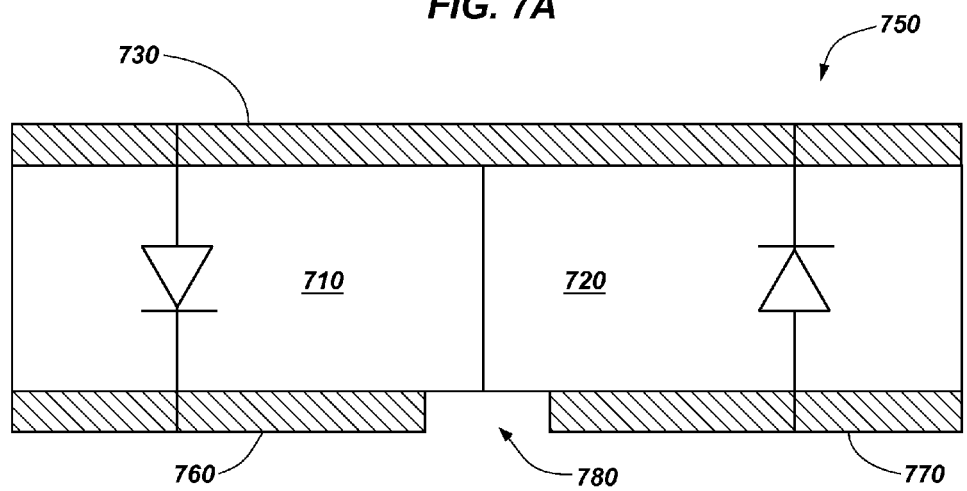
FIG. 7B is an enlarged view of a bond pad of the electronic device of FIG. 7A.

In FIG. 7A, the first substrate 110 again comprises circuitry 140 disposed in a portion thereof. In at least some embodiments, at least a portion of the circuitry 140 may comprise a plurality of conductive traces extending at least substantially parallel to each other through a portion of the first substrate 110. Bond pads 750 are disposed on the surface 160 of the first substrate 110 and a plurality of vias 170 extend from adjacent at least a portion of the circuitry 140 to the bond pads 750. The bond pads 750 comprise a selection device 705 formed in a portion thereof configured to enable access to a plurality of discrete vias 170. In at least some embodiments, the selection device 705 may comprise a plurality of diodes or similar rectifying devices. FIG. 7B is an enlarged view of a bond pad 750 of the electronic device 700 of FIG. 7A, indicated by the designation 7B in FIG. 7A and appropriate broken lead line and oval. Each bond pad 750 of the electronic device 700 may comprise a first diode 710 and a second diode 720, positioned in side-by-side relationship. The first diode 710 and the second diode 720 may both be coupled to a common upper conductive pad 730 disposed over a portion of each diode 710, 720. The first diode 710 is coupled to a first lower conductive pad 760, and the second diode 720 is coupled to a second lower conductive pad 770, the first lower conductive pad 760 and second lower conductive pad 770 being electrically isolated from each other by a gap 780. The conductive bump 130 (FIG. 7A) is coupled to the upper conductive pad 730 in some embodiments, or the upper conductive pad 730 may be omitted and the conductive bump 130 may be coupled directly to the first diode 710 and second diode 720. A via 170 (FIG. 7A) is coupled to each of the first lower conductive pad 760 and the second lower conductive pad 770.

The first diode 710 and second diode 720 are oriented to comprise opposing biasing schemes, such that the first diode 710 may be biased in a first direction and the second diode 720 may be biased in a second, opposing direction. For example, the first diode 710 may be forward biased (i.e., allowing a positive current to pass through and blocking a current of the opposite polarity) while the second diode 720 may be reverse biased (i.e., blocking a positive current and allowing a current of the opposite polarity to pass). In this configuration, a positive current through the conductive bump 130 will pass through the first diode 710 and the first lower conductive pad 760, enabling access to the circuitry 140 coupled with first lower conductive pad 760 and the associated via 170. The positive current is blocked by the second diode 720. Likewise, a current in the opposite polarity through the conductive bump 130 will pass through the second diode 720 and the second lower conductive pad 770, enabling access to the circuitry 140 coupled with the second lower conductive pad 770 and the associated via 170. The current in the opposite polarity is blocked by the first diode 710.

The first and second diodes 710, 720, respectively, may comprise any suitable structure or stack, which is known to those of ordinary skill in the art. By way of example and not limitation, the diodes may comprise crystalline silicon NP, or PN, structures, metal/double-insulator/metal diodes, filamentary structures that exhibit rectifying abilities, such as silver/amorphous silicon/p-type silicon stacks, as well as any other stack or structure having rectification features.

Figure 8:
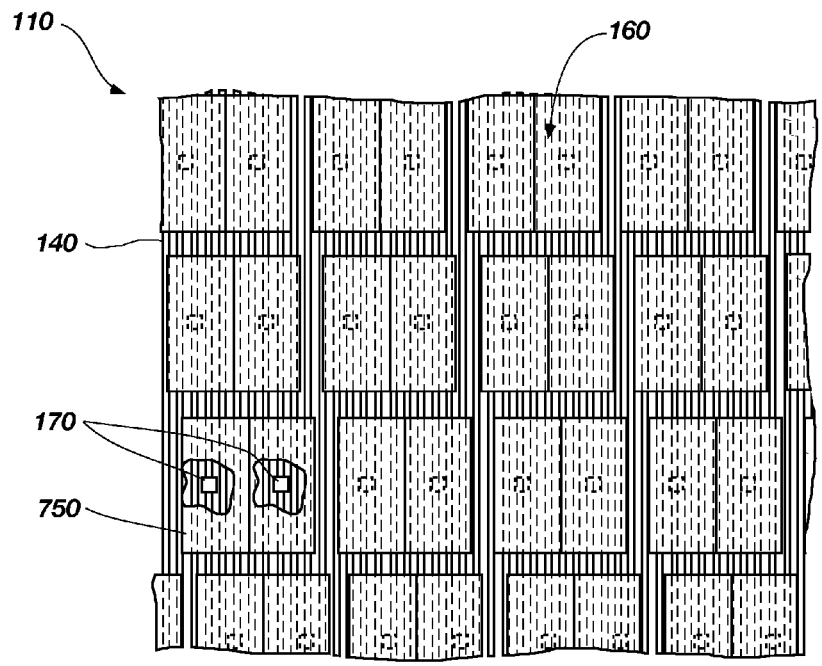
FIG. 8 illustrates a top view of the first substrate comprising bond pad structures including diodes formed thereon patterned according to at least one embodiment.

The bond pads 750 may be disposed on the surface 160 of the first substrate 110 comprising any one of a variety of patterns, such as those described above with relation to FIGS. 2 through 6. FIG. 8 illustrates a top view the first substrate 110 comprising bond pads 750 patterned according to at least one embodiment. According to at least some of such embodiments, the vias 170 may be coupled to the center, or at least substantially the center, of the respective first and second lower conductive pads 760, 770 (FIG. 7B) associated with each bond pad 750, and the vias 170 may be coupled to the circuitry 140 according to a predefined pattern. In the embodiment of FIG. 8, the vias 170 of each bond pad 750 are positioned in a pattern wherein each via 170 is coupled to a conductive trace immediately adjacent to the conductive trace to which the via 170 above and below (as oriented in FIG. 8) is coupled. The bond pads 150 are, therefore, shifted in accordance with the pattern of the vias 170.

In at least some embodiments, the electronic device 100, 700 may comprise a memory device. In such embodiments, at least a portion of the circuitry 140 of the first substrate 110 may comprise a plurality of memory cells and at least a portion of the circuitry of the second substrate 120 may comprise support circuitry (e.g., charge pumps, decode and addressing, sense amplifiers, I/O circuits, etc.). By way of example and not limitation, in some embodiments, at least a portion of the circuitry 140 may comprise one or more magnetic shift registers, such as those disclosed in each of U.S. Pat. Nos. 7,236,386, 6,920,062, 6,898,132 and 6,834,005. Such a magnetic shift register comprises a fine track of ferromagnetic or ferrimagnetic material that can be magnetized in small sections or regions, which may also be characterized as domains, in one direction or another. Thus, information is stored in the domains in the track. An electrical current may be applied to the magnetic shift register track to move the magnetic moments within the domains along the track, and past magnetic tunneling junctions or the writing elements. The direction of the current controls the direction of the movement along the track of the magnetic moments within the domains.

This magnetic shift register track may be disposed in the first substrate 110 comprising a nanoscale pitch. The magnetic shift register may have any of a variety of shapes, including but not limited to, serpentine, straight, U-shaped, or otherwise, as well as combinations thereof. The vias 170 positioned to extend from adjacent a portion of the magnetic shift register to the bond pads 150 may be configured as magnetic tunneling junctions (as depicted in the leftmost via 170 in FIG. 1), writing elements, or similar devices, as well as combinations thereof.

A conventional magnetic tunneling junction (MTJ) generally comprises two layers of magnetic material separated by a thin layer of insulating material which comprises a tunneling barrier. The tunneling barrier is typically formed from an ultra thin layer of aluminum oxide, although it can also be formed from other insulating or semiconducting materials. One magnetic layer in the MTJ is typically a hard magnetic material that requires a large magnetic field to change its magnetization. The other magnetic material is typically a soft magnetic material, allowing a weak magnetic field to change its magnetization. When a small magnetic field is applied to the soft magnetic material, its direction of magnetization changes so that the direction of the magnetization of the soft magnetic layer can be varied relative to that of the hard magnetic material.

The magnitude of the current passed through the tunneling barrier depends on the relative magnetic orientation of the two magnetic materials in the tunneling junction. Consequently, the value of the current in the tunneling junction indicates the direction of the magnetic moment in the soft magnetic material if the moment in the hard layer is known or the current in the tunneling junction indicates the direction of the moment of the hard magnetic material if the direction of the moment of the soft magnetic material is known.

The two magnetic materials in the magnetic tunneling junction can also be formed from hard magnetic materials if means for independently switching the magnetic moments in the MTJ are provided. The tunneling current passing through the MTJ allows the direction of the magnetic moment of either one of the two magnetic materials in the MTJ, i.e., the storage or sensing layer, to be determined if the direction of the magnetic moment of the other material, i.e., the reference layer, is known.

Embodiments of electronic devices of the present disclosure may be formed by separately forming the first substrate 110 and the second substrate 120. In at least some embodiments, first substrate 110 and the second substrate 120 may be processed at different temperatures. The circuitry 140 may be disposed in the first substrate 110. As set forth herein above, the circuitry 140 of the first substrate 110 may comprise conductive traces, including memory cells comprising one or more magnetic shift registers in the form of tracks disposed into the first substrate 110. Such circuitry 140, such as magnetic shift registers, may be formed comprising nanoscale electronic components, nanoscale pitch, or both. The support circuitry of the second substrate 120 may comprise conventional CMOS circuitry and may comprise substantially larger (e.g., microscale) electronic components, pitch, or both. The conventional CMOS circuitry may be formed according to conventional fabrication techniques and processes known to those of ordinary skill in the art.

In at least some embodiments, the circuitry 140 of the first substrate 110 may experience performance degradation at lower temperatures than the temperatures employed to process the second substrate 120. Therefore, the circuitry 140 of the first substrate 110 may be formed at temperatures substantially lower than the temperatures employed for forming circuitry disposed in the second substrate 120. For example, in embodiments in which the circuitry 140 of the first substrate 110 comprises magnetic shift registers, the circuitry 140 of the first substrate 110 may experience performance degradation when exposed to temperatures of about 450° C. or more. The support circuitry of the second substrate 120 may comprise conventional CMOS circuitry formed with conventional Front-End-Of-Line (FEOL) or Back-End-Of-Line (BEOL) CMOS processing. Conventional FEOL processes may employ temperatures as high as about 1,000° C. to 1,100° C., or higher, while conventional BEOL processes may employ temperatures as high as about 450° C.

A plurality of vias 170 may be formed in a portion of the first substrate 110, the vias 170 extending from the surface 160 to adjacent the circuitry 140. The vias 170 may be formed using conventional techniques, such as laser ablation, wet or dry etching, or other suitable methods. As set forth herein above, in at least some embodiments, the vias 170 may be formed to comprise a magnetic tunneling junction, as is known to those of ordinary skill in the art.

The bond pads 150, 750 may be disposed on the surface 160 of the first substrate 110 by blanket deposition followed by selective etching using lithography, or other suitable methods, and the first substrate 110 may be bonded to the second substrate 120 using a plurality of conductive bumps 130 coupled to the second substrate 120 and the bond pads 150, 750 of the first substrate 110. The bond pads 150, 750 may be patterned on the surface 160 according to any suitable pattern, including without limitation any of the patterns described herein above with relation to FIGS. 2 through 6, and 8.

In at least some embodiments, as illustrated in FIGS. 7A and 7B, the bond pads 750 may be formed comprising a selection device formed therein. Such embodiments may include forming a first lower conductive pad 760 coupled to a first via 170 and a second lower conductive pad 770 coupled to a second via 170. The first and second lower conductive pads 760, 770 may be formed by comprising a gap 780 therebetween by blanket deposition followed by etching using lithography, or other suitable methods known to those of ordinary skill in the art. A first diode 710 may be formed on the first lower conductive pad 760 biased in a first direction and a second diode 720 may be formed on the second lower conductive pad 770 and biased in a second, opposing direction. The first and second diodes 710, 720 may be formed by conventional processing techniques known to those of ordinary skill in the art. By way of example and not limitation, the first diode 710 may be formed by depositing a diode stack in a first polarity, and then etching the diode stack so the stack only occupies the area of the first lower conductive pad 760. The first diode 710 may then be covered with a conventional etch stop according to the stack materials and a second diode stack may be deposited in a second, opposite polarity to form the second diode 720. In at least some embodiments, an upper conductive pad 730 may be formed over both the first diode 710 and the second diode 720.

The first substrate 110 and related nanoscale circuitry 140 may, therefore, be formed separate from the second substrate 120 and any related microscale support circuitry thereon, and the circuitry 140 of the first substrate 110 may be coupled to the circuitry of the second substrate 120 with the plurality of conductive bumps 130, which may be formed on the bond pads 150. Because the circuitry on the second substrate 120 may be formed on a larger scale, such circuitry may be formed more efficiently and at a significantly lower cost, while the circuitry 140 of the first substrate 110 may be formed on a smaller scale to increase performance (e.g., increased storage capacity, etc.). The second substrate 120 may then be bonded to the first substrate 110, and the circuitry of the second substrate 120 coupled to the circuitry 140 of the first substrate 110 to combine the circuitry of both substrates into a single device. In such embodiments, the first substrate 110 and circuitry 140 may be formed at lower temperatures than the temperatures employed in forming the second substrate 120 and any related circuitry, such as the support circuitry.

Figure 9:
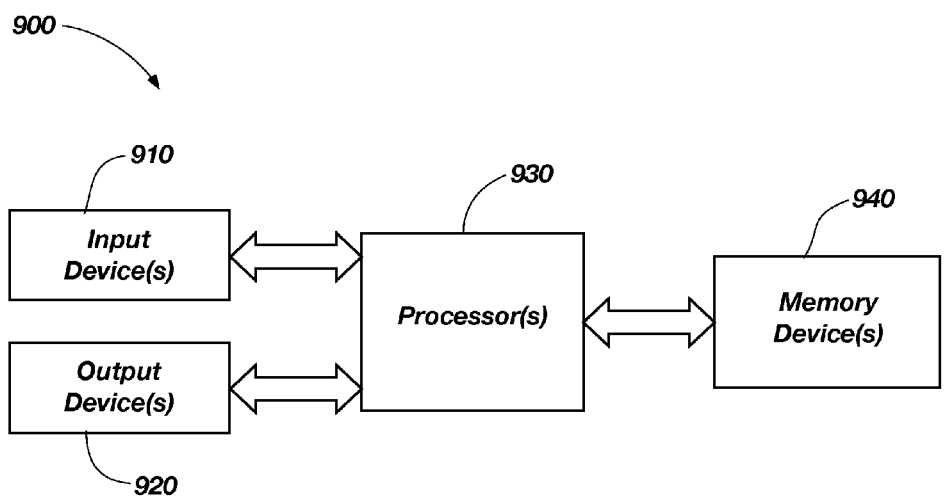
FIG. 9 is a flow chart of a computing system diagram showing at least one semiconductor memory device containing at least one memory device according to at least one embodiment of the present invention.
Figure 10:
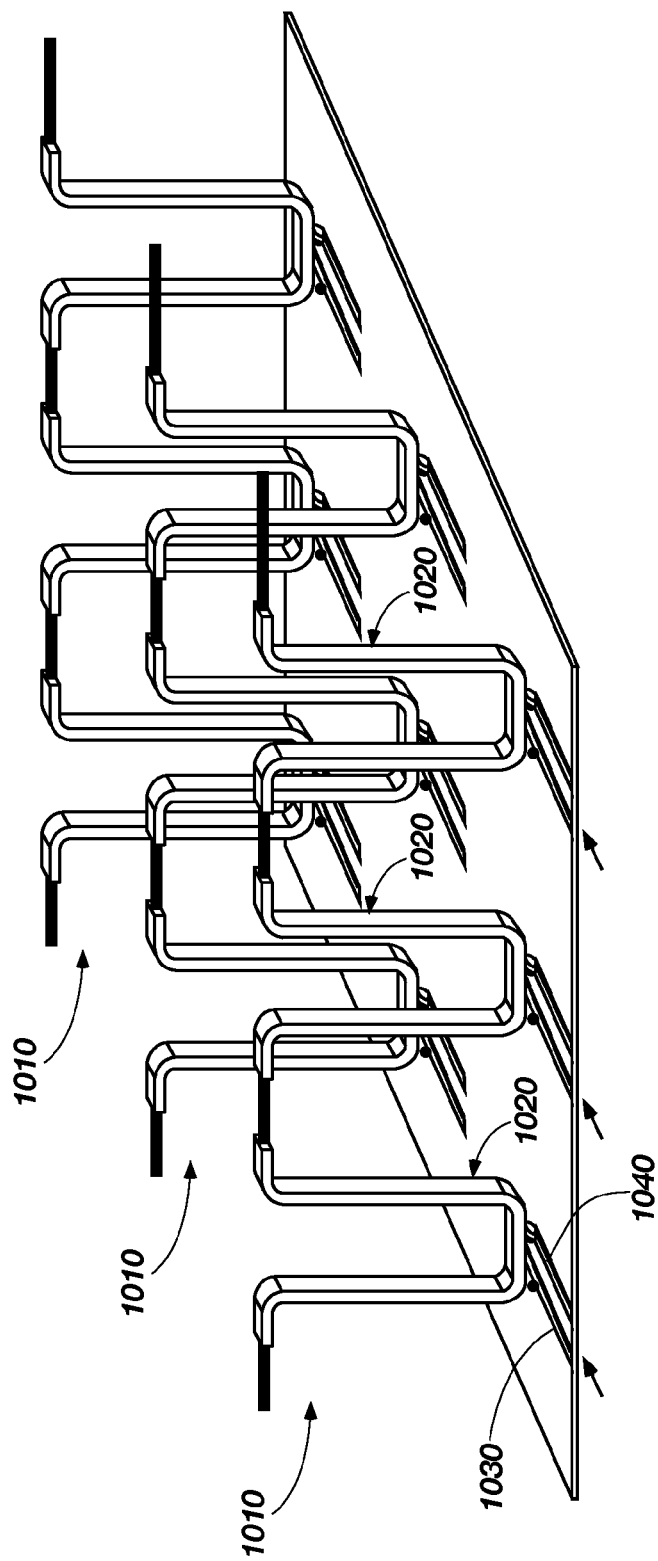
FIG. 10 is a perspective view illustrating a prior art embodiment of a racetrack memory array.

Additional embodiments of the present disclosure are directed to electronic systems. As shown in FIG. 9, an electronic system 900, such as a computer system, in accordance with an embodiment of the present invention, comprises at least one input device 910, at least one output device 920, at least one processor 930, and at least one memory device 940. As used herein, the term "computer system" includes not only computers such as personal computers and servers, but also wireless communications devices (e.g., cell phones, personal digital assistants configured for text messaging and email, etc.), cameras, chip sets, set-top boxes, controllers, vehicle and engine control and sensor systems, digital music players, and other combinations of the above-referenced input, output, processor and memory devices. The at least one memory device 940 may comprise at least one memory device (e.g., electronic devices 100, 700 in FIGS. 1 and 7A) comprising a first substrate coupled to a second substrate.

The first substrate may include circuitry comprising, by way of non-limiting example, a plurality of magnetic tracks comprising a plurality of domains, a plurality of magnetic tunneling junctions proximate to the plurality of magnetic tracks and extending to a location adjacent a surface of the first substrate, and a plurality of bond pads on the surface of the first substrate, each bond pad of the plurality of bond pads electrically coupled to a magnetic tunneling junction of the plurality of magnetic tunneling junctions.

The second substrate comprises support circuitry and is coupled to the plurality of bond pads on the surface of the first substrate with a plurality of conductive bumps. The support circuitry may comprise one or more of a charge pump, a decode-and-addressing circuit, a sense amplifier and an I/O circuit.

CONCLUSION

Various embodiments of the present disclosure are described above and directed toward embodiments of an electronic device and method for forming an electronic device comprising both nanoscale circuitry and microscale circuitry. In at least one embodiment, an electronic device may comprise a first substrate comprising circuitry. The circuitry of the first substrate may include a plurality of conductive traces extending at least substantially parallel to each other through a portion of the first substrate. A plurality of bond pads may be positioned on a surface of the first substrate and may comprise a width extending over at least two of the plurality of conductive traces. A plurality of vias may extend from adjacent at least some conductive traces of the plurality of conductive traces to bond pads of the plurality of bond pads. A second substrate comprising circuitry may be coupled to the plurality of bond pads on the first substrate and a plurality of conductive bumps may be bonded to the first substrate.

Additional embodiments may include electronic devices including a first substrate bearing circuitry components at a nanoscale pitch within the first substrate. The first substrate may include microscale bond pads on a surface of the first substrate. A via may electrically connect one of the microscale bond pads to one of the circuitry components. A second substrate may be electrically connected to at least one of the microscale bond pads.

Further embodiments are directed to memory devices. Various embodiments of such memory devices may comprise a first substrate including a plurality of magnetic tracks comprising a plurality of domains having domain walls. A plurality of magnetic tunneling junctions may be positioned proximate to the plurality of magnetic tracks and may extend to a location adjacent a surface of the first substrate. A plurality of bond pads may be positioned on the surface of the first substrate. Each bond pad of the plurality of bond pads may be electrically coupled to a magnetic tunneling junction of the plurality of magnetic tunneling junctions.

Additional embodiments comprise methods of forming an electronic device. One or more embodiments of such methods may comprise forming a first substrate and a second substrate. The first substrate may comprise a plurality of conductive traces extending through a portion thereof, a plurality of vias extending from adjacent at least some conductive traces of the plurality of conductive traces to a surface of the first substrate, and a plurality of bond pads on the surface of the first substrate and adjacent to a via of the plurality of vias. Each bond pad of the plurality of bond pads may comprise a width extending over at least two conductive traces of the plurality of conductive traces. The second substrate may comprise circuitry, and the second substrate may be attached to the first substrate with a plurality of conductive bumps coupled to the plurality of bond pads of the first substrate and to the circuitry of the second substrate.

Still further embodiments may include methods of forming electronic devices involving positioning a first substrate adjacent to a second substrate. The first substrate may bear circuitry components at a nanoscale pitch within the first substrate. The first substrate may include microscale bond pads on a surface of the first substrate. A via may electrically connect one of the microscale bond pads to one of the circuitry components. The second substrate may be electrically connected to at least one of the microscale bond pads.

In yet further embodiments, the disclosure includes methods of forming a memory device. According to various embodiments, such methods may comprise forming a plurality of conductive traces in a first substrate. The plurality of conductive traces may be configured as magnetic shift registers comprising a plurality of domains having domain walls. A plurality of vias may be formed comprising magnetic tunneling junctions extending from a surface of the first substrate to proximate the plurality of magnetic shift registers. A plurality of bond pads may also be formed, each bond pad of the plurality of bond pads being coupled to a via of the plurality of vias.

Still other embodiments of the disclosure include electronic systems. One or more embodiments of such systems may comprise at least one processor and at least one memory device coupled to the processor. The at least one memory device may comprise a first substrate and a second substrate. The first substrate may comprise a plurality of magnetic tracks including a plurality of domains having domain walls, a plurality of magnetic tunneling junctions proximate to the plurality of magnetic tracks and extending to a location adjacent a surface of the first substrate, and a plurality of bond pads on the surface of the first substrate. Each bond pad of the plurality of bond pads is electrically coupled to a magnetic tunneling junction of the plurality of magnetic tunneling junctions. The second substrate may comprise support circuitry and may be bonded to the plurality of bond pads with a plurality of conductive bumps.

While certain embodiments have been described and shown in the accompanying drawings, such embodiments are merely illustrative and not restrictive of the scope of the invention, and this invention is not limited to the specific constructions and arrangements shown and described, since various other additions and modifications to, and deletions from, the described embodiments will be apparent to one of ordinary skill in the art. Thus, the scope of the invention is only limited by the literal language, and legal equivalents, of the claims which follow.

What is claimed is:

1. An electronic device, comprising:
a first substrate comprising:
circuitry components within the first substrate, a distance between centers of at least some adjacent circuitry components of the circuitry components being a nanoscale distance;
a microscale bond pad on a surface of the first substrate; and
a via electrically connecting the microscale bond pad to one of the circuitry components; and
a second substrate electrically connected to the microscale bond pad.

2. The electronic device of claim 1, wherein the microscale bond pad is located over at least two of the circuitry components.

3. The electronic device of claim 1, wherein the via is offset from a geometrical center of the microscale bond pad.

4. The electronic device of claim 1, wherein the via is aligned with a geometrical center of the microscale bond pad.

5. The electronic device of claim 1, further comprising additional microscale bond pads on the surface of the first substrate and additional vias electrically connecting respective bond pads of the additional microscale bond pads to additional respective circuitry components of the circuitry components.

6. The electronic device of claim 5, wherein each of the microscale bond pads exhibits a shape selected from the group consisting of square, rectangular, hexagonal, and triangular.

7. The electronic device of claim 6, wherein the microscale bond pads collectively form a bond raster pattern or a bond shift pattern.

8. The electronic device of claim 1, wherein at least some of the circuitry components are conductive traces extending at least substantially parallel to each other through a portion of the first substrate.

9. The electronic device of claim 8, wherein the conductive traces are magnetic shift registers including a plurality of domains and the vias are a plurality of magnetic tunneling junctions.

10. The electronic device of claim 8, wherein at least some of the circuitry components are memory cells and at least another of the circuitry components is a charge pump, a decode-and-addressing circuit, a sense amplifier, or an I/O circuit.

11. The electronic device of claim 1, wherein an area of the microscale bond pad is 2,000 µm² or greater.

12. The electronic device of claim 1, wherein the nanoscale distance between centers of the at least some adjacent circuitry components is 100 nm or less.

13. A method of forming an electronic device, comprising:
positioning a first substrate adjacent to a second substrate, the first substrate comprising
circuitry components within the first substrate, a distance between centers of at least some adjacent circuitry components of the circuitry components being a nanoscale distance;
a microscale bond pad on a surface of the first substrate; and
a via electrically connecting the microscale bond pad to one of the circuitry components; and
electrically connecting the second substrate to the microscale bond pad.

14. The method of claim 13, further comprising forming the circuitry components within the first substrate at a first temperature and forming circuitry within the second substrate at a second, higher temperature.

15. The method of claim 14, wherein forming the circuitry components at the first temperature comprises forming the circuitry components at a temperature below 450° C.

16. The method of claim 14, wherein forming the circuitry within the second substrate at the second, higher temperature comprises forming the circuitry within the second substrate at a temperature below 1,100° C.

17. The method of claim 13, further comprising forming the circuitry components within the first substrate, the nanoscale distance between the centers of the at least some adjacent circuitry components being 100 nm or less.

18. The method of claim 13, further comprising forming a surface of the microscale bond pad to exhibit an area of 2,000 µm² or greater.

19. The method of claim 13, further comprising forming additional microscale bond pads on the surface of the first substrate, the microscale bond pads collectively forming a bond raster pattern and a bond shift pattern.

20. The method of claim 13, further comprising positioning a geometrical center of the microscale bond pad at a location offset from the via.

* * * * *